(12) United States Patent
Hsiao

(10) Patent No.: US 7,480,890 B2
(45) Date of Patent: Jan. 20, 2009

(54) METHOD FOR CORRECTING AND CONFIGURING OPTICAL MASK PATTERN

(75) Inventor: Li-Tung Hsiao, Taichung County (TW)

(73) Assignee: Powerchip Semiconductor Corp., Hsinchu (TW)

( * ) Notice: Subject to any disclaimer, the term of this patent is extended or adjusted under 35 U.S.C. 154(b) by 597 days.

(21) Appl. No.: 11/163,123

(22) Filed: Oct. 5, 2005

(65) Prior Publication Data

US 2007/0037066 A1 Feb. 15, 2007

(51) Int. Cl.
  *G06F 17/50* (2006.01)
  *G06F 19/00* (2006.01)
  *G03F 1/00* (2006.01)
  *G21K 5/00* (2006.01)

(52) U.S. Cl. .......................... 716/21; 430/5; 700/120; 700/121; 378/35

(58) Field of Classification Search .................. 716/21; 700/119, 120, 121; 430/5; 378/35
See application file for complete search history.

(56) References Cited

U.S. PATENT DOCUMENTS

| | | | |
|---|---|---|---|
| 6,899,981 B1* | 5/2005 | Galan et al. | 430/5 |
| 6,994,940 B2* | 2/2006 | Nakao | 430/5 |
| 7,146,035 B2* | 12/2006 | Okada et al. | 382/144 |
| 7,213,226 B2* | 5/2007 | Kotani et al. | 716/21 |
| 7,275,227 B1* | 9/2007 | Ying | 716/5 |
| 2003/0054642 A1* | 3/2003 | Kagotani et al. | 438/689 |
| 2003/0152873 A1* | 8/2003 | Tainaka et al. | 430/313 |
| 2003/0219660 A1* | 11/2003 | Ito et al. | 430/30 |
| 2003/0228048 A1* | 12/2003 | Okada et al. | 382/144 |
| 2004/0161677 A1* | 8/2004 | Nakao | 430/5 |
| 2005/0081180 A1* | 4/2005 | Kotani et al. | 716/21 |
| 2005/0146714 A1* | 7/2005 | Kitamura et al. | 356/237.2 |
| 2006/0049838 A1* | 3/2006 | Kobayashi | 324/699 |
| 2006/0085772 A1* | 4/2006 | Zhang | 716/4 |
| 2006/0105249 A1* | 5/2006 | Kushida et al. | 430/5 |

OTHER PUBLICATIONS

Gupta et al., "A Cost-Driven Lithographic Correction Methodology Based on Off-the-Shelf Sizing Tools", 2003 Proceedings of Design Automation Conference, Jun. 2-6, 2003, pp. 16-21.*

* cited by examiner

*Primary Examiner*—Phallaka Kik
(74) *Attorney, Agent, or Firm*—Jianq Chyun IP Office

(57) ABSTRACT

A method of correcting a mask pattern is described. A testing mask including a plurality of original patterns configured according to an original drawing data is provided. The original patterns in the testing mask are transferred to a photoresistant layer to form a plurality of first post-development patterns and measure first dimensions of the first post-development patterns. A pattern shrink process is performed on the first post-development patterns to form a plurality of first post-shrink patterns and measure second dimensions of the first post-shrink patterns. The bias of each the first dimensions and the second dimensions are calculated. The original drawing data, the first sizes, the second sizes and the bias are collected to set a database. The data of the database is used to establish an optical proximity correction (OPC) model. According to the OPC model, an original drawing data is corrected to obtain a corrected drawing data.

15 Claims, 1 Drawing Sheet

METHOD FOR CORRECTING AND CONFIGURING OPTICAL MASK PATTERN

BACKGROUND OF THE INVENTION

1. Field of the Invention

The present invention relates to a method for correcting and configuring a photolithographic pattern, particularly to a method for correcting and configuring an optical mask pattern.

2. Description of Related Art

Recently, the semiconductor has focused on the development of miniature integrated circuit (IC) element design. Photolithography plays a key role in such a miniaturization development for semiconductor industry because it determines critical dimensions (CDs) of thin film patterns related to semiconductor element structures.

To meet the increasing dement for semiconductor components of smaller sizes and higher resolutions, the KrF exposure machine is used together with a phase shift mask (PSM). However, further advancement of exposure machine requires light source of shorter wavelengths, such as: KrF laser (248 nm), ArF laser (193 nm), $F_2$ laser (157 nm), and $Ar_2$ laser (126 nm) for less linewidths and smaller component sizes. However, exposure devices are either too expensive or under development.

Therefore, a novel pattern shrink technology, chemical shrink process, is provided. Said chemical shrink process includes coating chemical shrink agent on an exposed and developed photo-resistant layer for subsequent baking process to form a new material layer configured at the sidewalls of patterns in the photo-resistant layer.

A typical chemical shrink process usually employs a certain bias value to pre-estimate a shrinkage magnitude, wherein the bias value is equal to the CD of the already shrunk pattern minus the CD of pattern yet to be shrunk. Additionally, the bias value is used for determining the target CD of the developed pattern on the photo-resistant layer and the target CD is used for correcting the dimension of the original pattern of optical masks. However, using a single bias value for correcting different original patterns of the equivalent CD and different pattern densities fails to produce desired results with possibly seriously negative impact on productivity, reliability and workability of elements.

SUMMARY OF THE INVENTION

An objective of the invention is to provide a method for correcting and configuring an optical mask pattern with different CD bias values for correcting optical mask patterns. Patterns obtained on wafers according to the method are relatively accurate with improved reliability and the A-grade ratio in production.

The present invention provides a method for correcting an optical mask pattern. The method includes: preparing a test optical mask including a plurality of original patterns configured according to original drawing data; transferring the original patterns to a first photo-resistant layer corresponding to the forming of a plurality of first post-development patterns, and measuring first dimensions of all the first post-development patterns, respectively; a pattern shrink process of the first post-development patterns is performed corresponding to the forming of a plurality of first post-shrinkage pattern, and measuring second dimensions of all the first post-shrinkage patterns, respectively; calculating the bias value between the first dimensions and the second dimensions, and collecting data of the original patterns, the first dimensions, the second dimensions and the bias value for information in the database; building an optical proximity effect correction (OPC) module in accordance with such information in the database, and correcting the original drawing data according to the correcting module for the data of the corrected drawing.

According to an embodiment of the invention, the method for correcting an optical mask pattern further includes the process of a first verifying step for verifying the OPC module after building an OPC module in accordance with the database. The first verifying step includes: building a verifying fitting curve module with the original drawing data and the first dimensions; comparing the OPC module with the verifying fitting curve module to determine whether the plurality of second post-development patterns preformed on the second photo-resistant layer correct or not. If it is incorrect, the step of building the OPC module repeats. According to an embodiment of the invention, the method for correcting an optical mask pattern further includes the process of a second verifying step for the OPC module after the first verifying step. The second verifying step includes: comparing the OPC module and the original drawing data to determine whether the plurality of second post-shrinkage patterns preformed on the second photo-resistant layer correct or not. If it is incorrect, the step of building the OPC module repeats.

According to an embodiment of the invention, the pattern shrink process discussed above includes a chemical shrink process, a thermal flow process, a chemical amplification of resist line process or a double exposure with Levnson-type phase shift masks process.

According to an embodiment of the invention, the foregoing original drawing data includes critical dimensions (CDs), pattern density, and duty ratio.

The present invention further provides a method for configuring an optical mask pattern. Said method for configuring an optical mask pattern includes: forming a plurality of original patterns on a test optical mask according to an original drawing data; transferring the original patterns to a first photo-resistant layer corresponding to the forming of a plurality of first post-development patterns and measuring first dimensions of all the first post-development patterns, respectively; a pattern shrink process of the first post-development patterns corresponding to the forming of a plurality of first post-shrinkage pattern, and measuring second dimensions of all the first post-shrinkage patterns, respectively; calculating the bias value between the first dimensions and the second dimensions, and collecting data of the original patterns, the first dimensions, the second dimensions and the bias value for information in the database; building an OPC module in accordance with the database and correcting the original drawing data according to the OPC module for a corrected drawing data; a writing step is applied to write the corrected drawing data onto an optical mask and to configure a pattern on the optical mask.

According to an embodiment of the invention, the method for configuring an optical mask pattern further includes the process of a first verifying step for the an OPC module after building an OPC module in accordance with the database. The first verifying step includes: building a verifying fitting curve module with the original drawing data and the first dimensions; comparing the OPC module with the verifying fitting curve module to determine whether the plurality of second post-development patterns preformed on the second photo-resistant layer correct or not. If it is incorrect, the step of building the OPC module repeats. According to an embodiment of the invention, the method for configuring an optical mask pattern further includes the process of a second verifying step for the OPC module after the first verifying step. The second verifying step includes: comparing the OPC module and the original drawing data to determine whether the plurality of second post-shrinkage patterns preformed on the second photo-resistant layer correct or not. If it is incorrect, the step of building the OPC module repeats.

According to an embodiment of the invention, the pattern shrink process discussed above includes a chemical shrink process, a thermal flow process, a chemical amplification of resist line process or a double exposure with Levnson-type phase shift masks process.

According to an embodiment of the invention, the original drawing data above includes critical dimensions (CDs), pattern density, and duty ratio.

According to an embodiment of the invention, the wiring step above includes the process of an electron beam or a laser beam.

According to the present invention, data obtained from a chemical shrink process and OPE are collected for building a database. An OPC module is obtained from the database by calculation and is used for correcting original drawing data to obtain a target CDs for the original wiring distribution. Therefore, the production cost can be saved with improved the reliability and the A-grade ratio in production.

BRIEF DESCRIPTION OF THE DRAWING

The accompanying drawing is included to provide a further understanding of the invention, and is incorporated in and constitutes a part of this specification. The drawings illustrate embodiments of the invention and, together with the description, serve to explain the principles of the invention.

DESCRIPTION OF THE EMBODIMENTS

Figure 1:
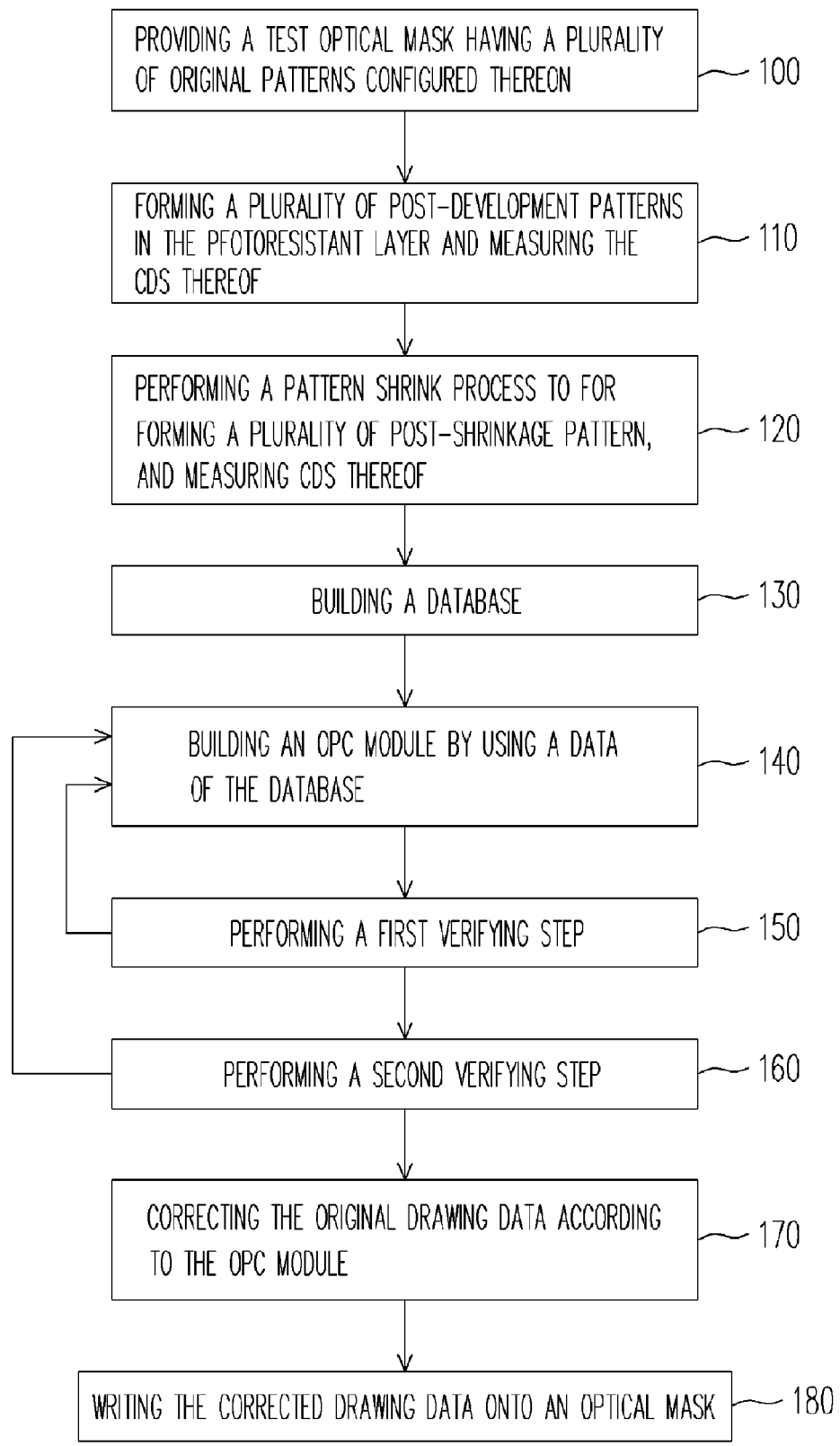
FIG. 1 is a flow chart of an embodiment of a method for configuring an optical mask according to the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a flow chart of an embodiment of a method for configuring an optical mask according to the invention.

Referring to FIG. 1, in step 100, a test optical mask is provided. The test optical mask includes a plurality of original patterns thereby configured according to original drawing data. The original patterns can be configured by an original drawing data of the original designed wiring pattern to the test optical mask. The original drawing data includes CDs, pattern dimensions and duty ratio of the original designed wiring pattern.

In step 110, transferring the original patterns of the test optical mask to a photo-resistant layer corresponding to the forming of a plurality of post-development patterns and measuring CDs of all of each of the post-development patterns. The method for transferring the original patterns of the test optical mask to the photo-resistant layer may include a conventional exposure process and developing procedure known to those skilled in the art and are not to be further illustrated herein. The CDs of the post-development patterns are measured with a scanning electron microscopy (SEM) or optical microscopy (OM). In general, as the originally exposed and developed patterns transferred to the photo-resistant layer, interference of a light source for the step of exposure will occur and the photo-resistant agent of the photo-resistant layer will effect the results of post-development patterns with problems including right angle rounding, line-end shortening, and linewidth increasing or decreasing, all of which are so called optical proximity effect (OPE).

In step 120, a pattern shrink process of the post-development patterns corresponding to the forming of a plurality of post-shrinkage pattern, and measuring CDs of all the post-shrinkage patterns, respectively. Similarly, the CDs of the post-development patterns are measured with a scanning electron microscopy (SEM) or optical microscopy (OM). The pattern shrink process includes a chemical shrink process, a thermal flow process, a chemical amplification of resist line process or a double exposure with Levnson-type phase shift masks process.

The chemical shrink process is exemplified for illustration purpose only, and the present invention should not be limited to. Herein, the foregoing chemical shrink process includes a resolution enhancement lithography assist by chemical shrink (RELACS) technology. The RELACS technology includes: coating chemical shrink agents onto an exposed and developed photo-resistant layer and a baking process to form a new material layer configured at the sidewalls of the patterns in the photo-resistant layer with the patterns shrunk thereby. Furthermore, it is noted that the shrinkage of the configured post-shrinkage patterns, obtained from the post-development patterns after the chemical shrink process, varies in accordance with the CDs, pattern density and duty ratio. Herein, the shrinkage of the configured post-shrinkage patterns above refers to the bias value between the CDs of the post-shrinkage patterns and the CDs of the post-development patterns.

In step 130, a data base built includes data obtained from: calculating the bias value between the CDs of each post-shrinkage pattern and the CDs of each pose-development pattern, and collecting data of the original drawing patterns, CDs of post-shrinkage patterns and CDs of pose-development patterns as well as the bias value therebetween for obtaining a database.

In step 140, an optical proximity effect correction (OPC) module is built in accordance with the database. The OPC module is built with commercial software, such as: an OPC software, calculating the data from the database and correcting the results.

Many factors, in particular, including reactant concentration, reactive period, diffusing speed and reacting area may affect the chemical shrink process. Therefore, a great amount of data must be collected to deduce mathematic modules, such as: the reactive dynamic module and substance transferring module for satisfying such a complicated reactive mechanism. In addition, the optical mask patterns can be corrected for obtaining the desired target CDs for original wiring design. Moreover, OPE incorporates more complexity and requires more data and more complicated deduction. The present invention builds a database according to the OPE and the chemical shrink process, and employs a commercial OPC software to calculate the database. An OPC module is subsequently built for correcting the original drawing data to obtain the desired target CDs for original wiring design. Therefore, the production cost can be saved with improved the reliability and the A-grade ratio in production.

According to an embodiment of the invention, following the step 140, the process of a first verifying step 150 performs for verifying OPC module above. The first verifying step is for judging that after the corrected patterns is written to the optical mask and transferred to the photo-resisted layer, whether the patterns preformed on photo-resistant layer in allowable dimension for processing or not. If it is allowable, a test fitting curve module is built with commercial software such as: post OPC verification software in accordance with the original drawing data and the CDs of the post development patterns. Additionally, comparing the OPC module to the verifying fitting curve module to determine whether the plurality of post-development patterns preformed on the photo-resistant layer correct or not. If it is not correct, it means there is any pattern bridge between post-development patterns or open patterns remained closed. Subsequently, the step 140 repeats to rebuild an OPC module.

According to an embodiment of the invention, following the step 150, the process of a second verifying step 160 performs for verifying OPC module above. The first verifying step is for determine whether the patterns formed therein correct or not after the corrected patterns written to the optical mask and transferred to the photo-resisted layer and after the chemical shrink process. If it is correct, a post OPC verification software is then employed to compare the OPC module to original drawing data to determine whether the plurality of post-development patterns preformed on the photo-resistant layer correct or not. If it is incorrect, the step 140 repeats to rebuild an OPC module.

As a result, the present invention employs commercial software (post OPC verification software) to verify the reliability and accuracy of the built OPC module and associated costs that can be saved.

Referring to the drawing again, in step 170, the original drawing data is corrected according to the OPC module and a corrected drawing data is obtained.

The steps 100 through 170 are about a method for correcting an optical mask pattern. Thereafter, a method for configuring an optical mask pattern can be further processed.

In step 180, the corrected drawing data is written onto the optical mask and a pattern is then configured on the optical mask. The writing step is an electron beam or a laser beam.

In summary, the present invention has at least the advantages as below: 1. The present invention builds an OPC module for correcting an optical mask pattern with a correcting process for eliminating the affection caused by the chemical shrink process and the OPE. Accordingly, patterns obtained on wafers according to the method are relatively accurate, and the reliability and the A-grade ratio of production are improved; 2. The present invention utilizes commercial software, instead of complicated deduction for correcting optical mask patterns to obtain desired original wiring distribution patterns to save production costs.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for correcting an optical mask pattern comprising:
   providing a test optical mask having a plurality of original patterns configured according to original drawing data;
   transferring the original patterns to a first photo-resistant layer corresponding to forming of a plurality of first post-development patterns, and measuring first dimensions of all of each of the first post-development patterns;
   conducting a pattern shrink process to the first post-development patterns corresponding to forming of a plurality of first post-shrinkage pattern, and measuring second dimensions of all of each of the first post-shrinkage patterns;
   calculating a bias value between the first dimensions and the second dimensions, and collecting data of the original patterns, the first dimensions, the second dimensions and the bias value for obtaining a database;
   building an optical proximity effect correction (OPC) module in accordance with the database; and
   correcting the original drawing data according to the OPC module so as to obtain a corrected drawing data.

2. The method for correcting an optical mask pattern according to claim 1, further comprising:
   performing a first verifying step for the OPC module after the OPC module is built.

3. The method for correcting an optical mask pattern according to claim 2, wherein the first verifying step comprises:
   building a verifying fitting curve module with the original drawing data and the first dimensions; and
   comparing the OPC module to the verifying fitting curve module to judge whether a plurality of second post-development patterns preformed on a second photo-resistant layer are correct or not, and if it is incorrect, the step of building the OPC module repeats.

4. The method for correcting an optical mask pattern according to claim 2, further comprising:
   performing a second verifying step for the OPC module after the first verifying step.

5. The method for correcting an optical mask pattern according to claim 4, wherein the second verifying step further comprises:
   comparing the OPC module and the original drawing data to determine whether a plurality of second post-shrinkage patterns preformed on a second photo-resistant layer are correct or not, and if it is incorrect, the step of building the OPC module repeats.

6. The method for correcting an optical mask pattern according to claim 1, wherein the pattern shrink process comprises a chemical shrink process, a thermal flow process, a chemical amplification of resist line process or a double exposure with Levnson-type phase shift masks process.

7. The method for correcting an optical mask pattern according to claim 1, wherein the original drawing data comprises critical dimensions (CDs), pattern density, and duty ratio.

8. A method for configuring an optical mask pattern comprising:
   performing a plurality of original patterns on a test optical mask according to original drawing data;
   transferring the original patterns to a first photo-resistant layer corresponding to forming of a plurality of first post-development patterns, and measuring first dimensions of all of the first post-development patterns, respectively;
   performing a pattern shrink process to the first post-development patterns corresponding to forming of a plurality of first post-shrinkage pattern, and measuring second dimensions of all the first post-shrinkage patterns, respectively;
   calculating a bias value between the first dimensions and the second dimensions, and collecting data of the original patterns, the first dimensions, the second dimensions and the bias value for obtaining information for a database;
   building an optical proximity effect correction (OPC) module in accordance with the database;
   correcting the original drawing data according to the OPC module so as to obtain a corrected drawing data;

a writing step performed to write the corrected drawing data onto an optical mask and to configure a pattern on the optical mask.

9. The method for configuring an optical mask pattern according to claim 8, further comprising: performing a first verifying step for the OPC module after the OPC module is built.

10. The method for configuring an optical mask pattern according to claim 9, wherein the first verifying step comprises:

building a verifying fitting curve module with the original drawing data and the first dimensions; and comparing the OPC module to the verifying fitting curve module to determine whether a plurality of second post-development patterns preformed on a second photo-resistant layer are correct or not, and if it is incorrect, the step of building the OPC module repeats.

11. The method for configuring an optical mask pattern according to claim 9, further comprising:

performing a second verifying step for the OPC module after the first verifying step.

12. The method for configuring an optical mask pattern according to claim 11, wherein the second verifying step further comprises:

comparing the OPC module and the original drawing data to determine whether a plurality of second post-shrinkage patterns preformed on a second photo-resistant layer are correct or not, and if it is incorrect, the step of building the OPC module repeats.

13. The method for configuring an optical mask pattern according to claim 8, wherein the pattern shrink process includes a chemical shrink process, a thermal flow process, a chemical amplification of resist line process or a double exposure with Levnson-type phase shift masks process.

14. The method for configuring an optical mask pattern according to claim 8, wherein the original drawing data comprises critical dimensions (CDs), pattern density, and duty ratio.

15. The method for configuring an optical mask pattern according to claim 8, wherein the wiring step is performed with an electron beam or a laser beam.

* * * * *